(12) United States Patent
Kim et al.

(10) Patent No.: US 7,952,364 B2
(45) Date of Patent: May 31, 2011

(54) POWER NOISE DETECTING DEVICE AND POWER NOISE CONTROL DEVICE USING THE SAME

(75) Inventors: Hyung-Soo Kim, Ichon (KR); Yong-Ju Kim, Ichon (KR); Sung-Woo Han, Ichon (KR); Hee-Woong Song, Ichon (KR); Ic-Su Oh, Ichon (KR); Tae-Jin Hwang, Ichon (KR); Hae-Rang Choi, Ichon (KR); Ji-Wang Lee, Ichon (KR); Jae-Min Jang, Ichon (KR); Chang-Kun Park, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/332,294

(22) Filed: Dec. 10, 2008

(65) Prior Publication Data

US 2010/0039099 A1 Feb. 18, 2010

(30) Foreign Application Priority Data

Aug. 12, 2008 (KR) ........................ 10-2008-0078808

(51) Int. Cl.
G01R 29/26 (2006.01)
(52) U.S. Cl. .................. 324/613; 324/614; 324/551
(58) Field of Classification Search .................. 361/18, 361/276; 323/908, 241, 284, 312; 327/551, 327/198; 713/300; 324/613
See application file for complete search history.

(56) References Cited

U.S. PATENT DOCUMENTS

| | | | | |
|---|---|---|---|---|
| 3,821,648 A * | 6/1974 | Campbell | ................... | 455/226.3 |
| 4,207,516 A * | 6/1980 | Babcock | ........................ | 323/238 |
| 4,754,213 A * | 6/1988 | Dubot et al. | .................. | 323/326 |
| 4,800,329 A * | 1/1989 | Masaki | ........................ | 323/242 |
| 4,910,654 A * | 3/1990 | Forge | ........................... | 363/49 |
| 5,287,263 A * | 2/1994 | Shilo | ........................... | 363/143 |
| 5,420,780 A * | 5/1995 | Bernstein et al. | ............... | 363/89 |
| 5,715,154 A * | 2/1998 | Rault | ........................... | 363/89 |
| 5,834,924 A * | 11/1998 | Konopka et al. | .............. | 323/222 |
| 5,835,365 A * | 11/1998 | Lee | ........................... | 363/49 |
| 5,990,581 A * | 11/1999 | Ikegami et al. | ............... | 307/131 |
| 6,154,090 A * | 11/2000 | Wissmach et al. | ............ | 327/552 |
| 6,157,097 A * | 12/2000 | Hirose et al. | ................... | 307/125 |
| 6,163,469 A * | 12/2000 | Yuki | ............................. | 363/53 |
| 6,281,669 B1 * | 8/2001 | Brakus | ........................ | 323/324 |
| 6,285,569 B1 * | 9/2001 | Hall et al. | .................. | 363/21.15 |
| 6,427,065 B1 * | 7/2002 | Suga et al. | .................... | 455/41.1 |
| 6,487,098 B2 * | 11/2002 | Malik et al. | .................... | 363/89 |
| 6,556,685 B1 * | 4/2003 | Urry et al. | .................... | 381/94.1 |
| 6,737,845 B2 * | 5/2004 | Hwang | ........................ | 323/284 |
| 6,924,886 B2 | 8/2005 | Yang | | |
| 6,972,546 B2 * | 12/2005 | Kobayashi | ..................... | 323/225 |
| 7,110,271 B2 * | 9/2006 | Jang et al. | ....................... | 363/50 |
| 7,139,952 B2 | 11/2006 | Matsumoto et al. | | |
| 7,224,154 B2 * | 5/2007 | Kasprzak et al. | ............ | 323/299 |

(Continued)

FOREIGN PATENT DOCUMENTS

| JP | 2004129103 | 4/2004 |
|---|---|---|
| JP | 2004129103 A | 4/2004 |
| KR | 1020000002708 | 1/2000 |
| KR | 1020000002708 A | 1/2000 |

(Continued)

*Primary Examiner* — Ha Tran T Nguyen
*Assistant Examiner* — Richard Isla Rodas
(74) *Attorney, Agent, or Firm* — Baker & McKenzie LLP

(57) ABSTRACT

A power noise detecting device includes a plurality of power lines, and a power noise detecting part configured to detect power noise by rectifying voltages of the plurality of power lines and converting the rectified voltages into effective voltages.

8 Claims, 3 Drawing Sheets

U.S. PATENT DOCUMENTS

| | | | |
|---|---|---|---|
| 7,304,456 B2 * | 12/2007 | Temesi et al. | 323/222 |
| 7,339,411 B2 | 3/2008 | Yuuki et al. | |
| 7,355,368 B2 * | 4/2008 | Salato et al. | 323/222 |
| 2002/0096677 A1 * | 7/2002 | Yuuki et al. | 257/48 |
| 2003/0128018 A1 * | 7/2003 | Telefus et al. | 323/284 |
| 2004/0124820 A1 * | 7/2004 | Haas | 323/284 |

FOREIGN PATENT DOCUMENTS

| | | |
|---|---|---|
| KR | 1020060076743 | 7/2006 |
| KR | 1020060076743 A | 7/2006 |
| KR | 10-2007-0036334 | 4/2007 |
| KR | 1020070064812 | 6/2007 |
| KR | 1020070064812 A | 6/2007 |

* cited by examiner

POWER NOISE DETECTING DEVICE AND POWER NOISE CONTROL DEVICE USING THE SAME

CROSS-REFERENCES TO RELATED APPLICATION

The present application claims priority under 35 U.S.C. §119(a) to Korean application number 10-2008-0078808, filed on Aug. 12, 2008, filed in the Korean Intellectual Property Office, which is incorporated herein by reference in its entirety as set forth in full.

BACKGROUND

1. Technical Field

The embodiments described herein relate to a semiconductor device, and more particularly, to a power noise detecting device and a power noise control device using the same.

2. Related Art

A power distribution network (PDN) is configured between a semiconductor integrated circuit (IC) device and an external apparatus to supply power to the semiconductor IC device from the external apparatus through the power distribution network. Parasitic components, such as capacitances, inductances, resistances, and the like, exist on the power distribution network. Accordingly, the parasitic components may have an negative influence on the proper operation of the semiconductor IC device. For example, the parasitic components may cause noise to be generated in the supplied power. Accordingly, a circuit is design to minimize the above-described parasitic components. One method includes use of a decoupling capacitor installed between power lines at a predetermined interval. However, the installation of the decoupling capacitor for reducing the parasitic components causes another parasitic component called an Equivalent Series Resistance (ESR) to be generated.

If the ESR is small, power distribution performance in a high-frequency region may be improved, but in a resonance frequency region between a semiconductor IC chip and a package covering the chip, as the ESR becomes smaller, the power noise becomes larger. Accordingly, it is necessary to optimize the ESR by considering various operational environments of the semiconductor IC. As a result, it is necessary to accurately detect the power noise.

However, since the semiconductor IC is commonly designed only to minimize the ESR, there is a problem in that the power noise cannot be reduced to a desired level. Furthermore, an analog/digital converter or a delay line is commonly used to detect the power noise for the purpose of controlling the ESR. However, a large circuit area is required to implement the analog/digital converter or the delay line, which causes a loss in layout area while increasing power consumption.

SUMMARY

A power noise detecting device and a power noise control device using the same capable of accurately detecting power noise and minimizing the power noise by implementing a simple circuit are described herein.

In one aspect, a power noise detecting device includes a plurality of power lines, and a power noise detecting part configured to detect power noise by rectifying voltages of the plurality of power lines and converting the rectified voltages into effective voltages.

In another aspect, a power noise control device includes a variable resistor part connected to a plurality of power lines to vary a resistance value according to a resistance value adjustment code signal, a power noise detecting part converting power noise of the power lines into an effective voltage to output the effective voltage, and a power noise control part varying the resistance value adjustment code signal according to a result acquired by comparing the effective voltage with a target code conversion voltage acquired by converting a target code signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
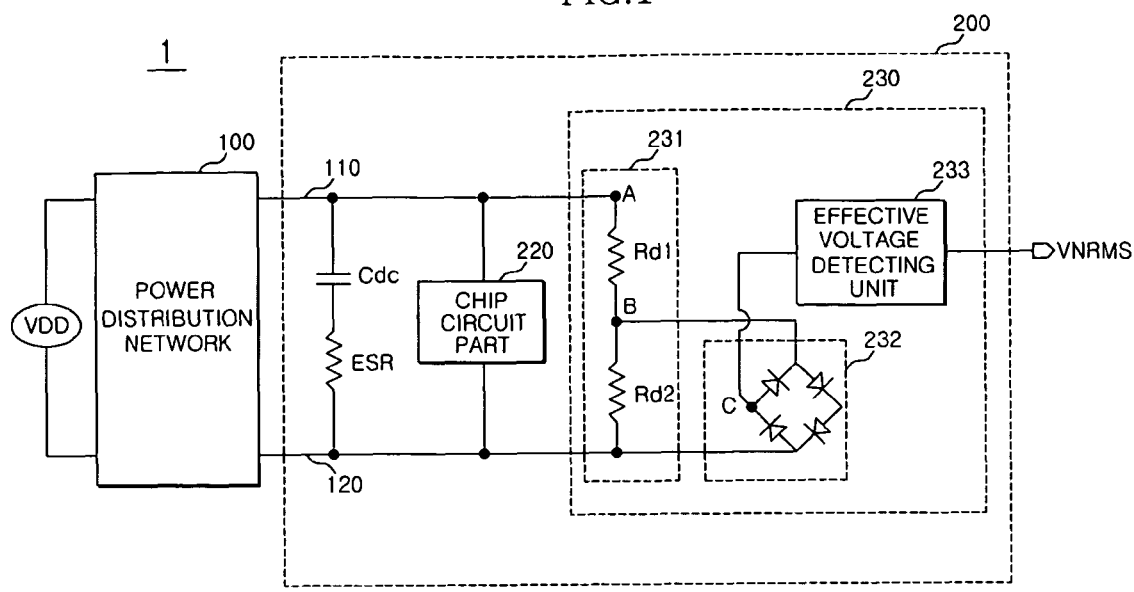
FIG. 1 is a schematic circuit diagram of an exemplary power noise detecting device according to one embodiment.

FIG. 1 is a schematic circuit diagram of an exemplary power noise detecting device according to one embodiment. In FIG. 1, a power noise detecting device 1 can be configured to include power lines 110 and 120 via a chip circuit part 220, and a power noise detecting part 230 for detecting the noise of power applied through the power lines 110 and 120, which can be installed in/on a semiconductor chip, such as a semiconductor IC 200.

A power distribution network 100 can be connected to the semiconductor IC 200 via the power lines 110 and 120. In addition, a decoupling capacitor Cdc, a parasitic resistance component, i.e., an Equivalent Series Resistance (ESR) generated by the decoupling capacitor Cdc, and the chip circuit part 220 can be interconnected between the power lines 110 and 120.

The chip circuit part 220 can represent a portion or an entirety of a circuit configuration including various signal processing circuits, memory cells, and the like constituting the semiconductor IC 200.

The power noise detecting part 230 can rectify voltages at both ends of the power lines 110 and 120, and can convert the rectified voltages into effective voltages and output the effective voltages. For example, the power noise detecting part 230 can include a power noise level adjusting unit 231, a rectification unit 232, and an effective voltage detecting unit 233.

The power noise level adjusting unit 231 can reduce the level of power noise applied to both ends of the power lines 110 and 120 to a level required for detecting the power noise. For example, the power noise level adjusting unit 231 can include first and second distribution resistors Rd1 and Rd2 connected to both ends of the power lines 110 and 120. Here, the first and second distribution resistors Rd1 and Rd2 can have substantially the same resistance value.

The rectification unit 232 can full-wave rectify and output the power noise level adjusting unit 231. Here, the rectification unit 232 can function by considering a parasitic capacitance value to minimize the distortion of the power noise. For example, the rectification unit 232 can be configured to include a bridge diode of which two input ends can be connected to both ends of the first distribution resistor Rd2.

The effective voltage detecting unit 233 can output an Root Menu Square (RMS) value of an output signal of the rectification unit 232, such as an effective voltage VNRMS. For example, the effective voltage detecting unit 233 can include a primary filter or a secondary filter formed by combining resistors and capacitors with each other.

Figure 2:
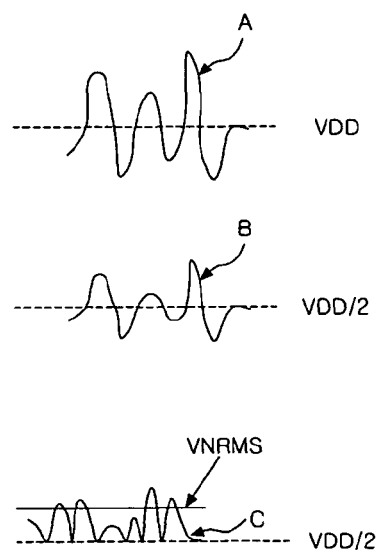
FIG. 2 is a power noise waveform diagram demonstrating exemplary operation for each component of the device of FIG. 1 according to one embodiment.

FIG. 2 is a power noise waveform diagram demonstrating exemplary operation for each component of the device of FIG. 1 according to one embodiment. An exemplary operation of a power noise detecting device will now be described with reference to FIG. 2.

In FIG. 2, the power noise of the power lines 110 and 120 can swing around the level of a power voltage VDD like a node A. However, since the level of the power voltage VDD can drop to one-half due to the power noise level adjusting unit 231, the power noise can also swing at a level corresponding to one-half of the original level like a node B. The power noise of the node B can be full-wave rectified by the rectification unit 232 like a node C. The full-wave rectified signal of the node C can be output as the effective voltage VNRMS by the effective voltage converting unit 233. Accordingly, the power noise detecting device 1 can detect the degree of the power noise according to the level of the effective voltage VNRMS.

Figure 3:
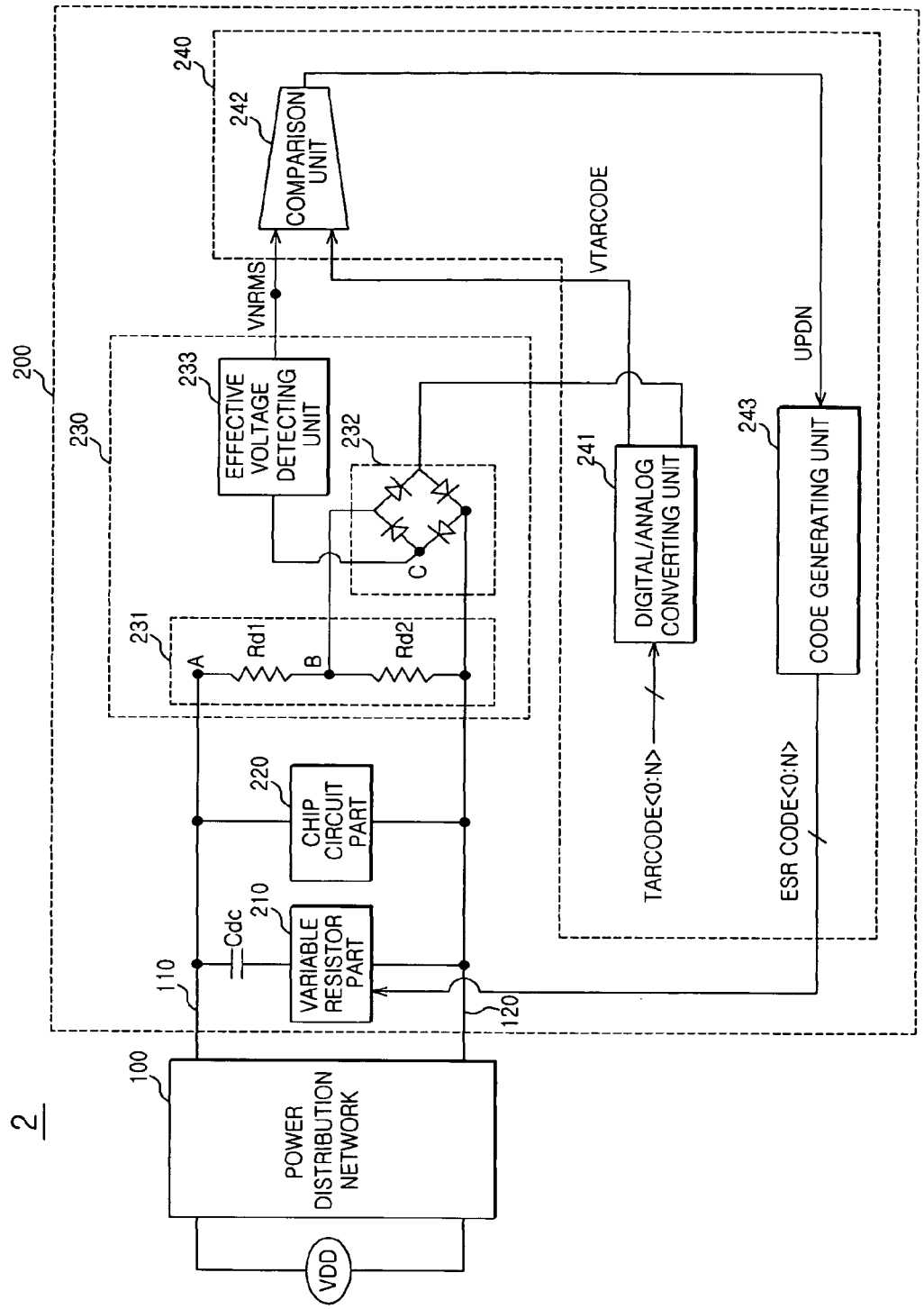
FIG. 3 is a schematic block diagram of another exemplary power noise control device according to one embodiment.

FIG. 3 is a schematic block diagram of another exemplary power noise control device according to one embodiment. In FIG. 3, a power noise control device 2 can detect power noise and can reduce the power noise by controlling a resistance value of a variable resistor configured to substitute for a parasitic resistance component (ESR) according to a detection result. Accordingly, the power noise control device 2 can use the power noise detecting 1 (in FIG. 1) as a configuration for detecting the power noise.

As shown in FIG. 3, the power noise control device 2 can be configured to include power lines 110 and 120, a variable resistor part 210, a chip circuit part 220, a power noise detecting part 230, and a power noise control part 240.

The variable resistor part 210 can be configured to vary the resistance value, i.e., the ESR according to a resistance value control code signal 'ESRCODE<0:N>'. For example, the variable resistor part 210 can be connected between a decoupling capacitor Cdc and the power line 120. Here, the ESR that is generated due to the decoupling capacitor Cdc can exist at a position connected with the variable resistor part 210, wherein the ESR is not intentionally configured by a circuit design but can be a parasitic component. For example, the ESR can be varied by the capacitance of the decoupling capacitor Cdc. The ESR can function as an index for increasing and decreasing the power noise, and although it can be varied, and the ESR cannot be considered to be actively controlled. Accordingly, the variable resistor part 210 can be connected to the decoupling capacitor Cdc to actively control the ESR. As a result, the ESR can be controlled according to the resistance value control code signal 'ESRCODE<0:N>'.

The chip circuit part 220 can represent a portion or an entirety of a circuit configuration including various signal processing circuits, the memory cells, and the like constituting the semiconductor IC 200.

The power noise detecting part 230 can rectify the voltages at both ends of the power lines 110 and 120, and can convert the rectified voltages into the effective voltages to detect the power noise. For example, the power noise detecting part 230 can include the power noise level adjusting unit 231, the rectification unit 232, and the effective voltage detecting unit 233.

The power noise level adjusting unit 231 can reduce the level of the power noise supplied to both ends of the power lines 110 and 120 to a level advantageous for detecting the power noise. For example, the power noise level adjusting unit 231 can be configured to include the first and second distribution resistors Rd1 and Rd2 connected to both ends of the power lines 110 and 120. Here, the first and second distribution resistors Rd1 and Rd2 can have substantially the same resistance value.

The rectification unit 232 can full-wave rectify and output the output of the power noise level adjusting unit 231. Here, the rectification unit 232 can function by considering the parasitic capacitance value to minimize the distortion of the power noise. For example, the rectification unit 232 can be configured to include the bridge diode of which two input ends are connected to both ends of the first distribution resistor Rd2.

The effective voltage detecting unit 233 can output the effective voltage VNRMS of the output signal of the rectification unit 232. For example, the effective voltage detecting unit 233 can include the primary filter or the secondary filter formed by combining the resistors and the capacitors with each other.

The power noise control part 240 can compare the effective voltage VNRMS with a target code conversion voltage VTARCODE acquired by converting a target code signal 'TARCODE<0:N>' to output a comparison result signal 'UPDN'. For example, the power noise control part 240 can vary the resistance value adjustment code signal 'ESRCODE<0:N>' according to the comparison result signal 'UPDN'.

The power noise control part 240 can include a digital/analog converting unit 241, a comparison unit 242, and a code generating unit 243.

The digital/analog converting unit 241 can convert the target code signal 'TARCODE<0:N>' into the target code conversion voltage VTARCODE to output the target code conversion voltage VTARCODE. In addition, the comparison unit 241 can compare the effective voltage VNRMS and the target code conversion voltage VTARCODE to output the comparison result signal 'UPDN'.

Variation of a potential difference of the rectification unit 232 can be supplied to the target code conversion voltage VTARCODE by connecting any one of the output terminals of the rectification unit 232 to a ground terminal of the digital/analog converting unit 241, such that the target code conversion voltage VTARCODE and the effective voltage VNRMS can be compared with each other by the comparison unit 241 in the same environment.

The code generating unit 243 can increase or decrease the resistance value adjustment code signal 'ESRCODE<0:N>' according to the comparison result signal 'UPDN' to output the resistance value adjustment code signal 'ESRCODE<0:N>'. For example, the code generating unit 243 can include a counter.

Figure 4:
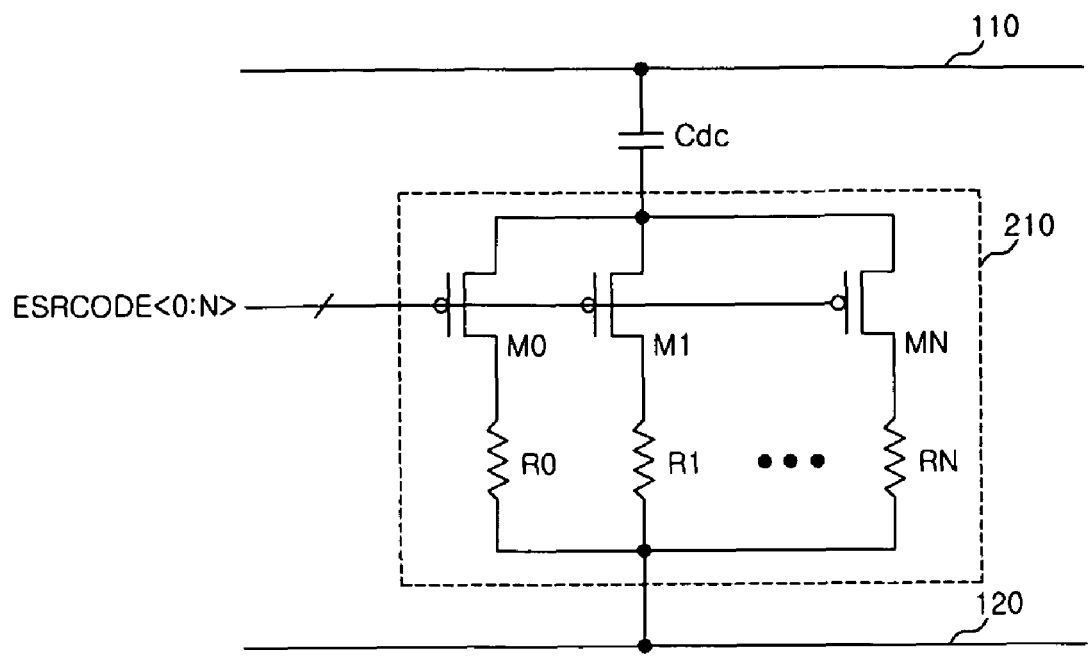
FIG. 4 is a schematic circuit diagram of an exemplary variable resistor part capable of being implemented in the device of FIG. 3 according to one embodiment.

FIG. 4 is a schematic circuit diagram of an exemplary variable resistor part capable of being implemented in the device of FIG. 3 according to one embodiment. In FIG. 4, the variable resistor part 210 can include a plurality of transistors M0 to MN commonly connected to the decoupling capacitor Cdc, and a plurality of resistors R0 to RN connected between the plurality of transistors M0 to MN and the power line 120. In the variable resistor part 210, the number of resistors connected to turned-ON transistors among the plurality of resistors R0 to RN can be increased or decreased according to a code value of the resistance value adjustment code signal 'ESRCODE<0:N>', resulting in varying the total resistance value. The total resistance value based on the resistors connected to the turned-ON transistors among the plurality of resistors R0 to RN can serve to function as the ESR. Here, the ESR can be actively controlled.

An exemplary operation of a power noise control device will now be described with reference to FIG. 2. As shown in FIG. 2, a result acquired by detecting the power noise in the power noise detecting part 230 can be output as the effective voltage VNRMS.

The digital/analog converting unit 241 can convert the target code signal 'TARCODE<0:N>' into an analog voltage. For example, the target code signal 'TARCODE<0:N>' can be converted and output as a target code conversion voltage VTARCODE. In the target code signal 'TARCODE<0:N>', the resistance value of the variable resistor part 210, i.e., the ESR value is set to an optimum value to minimize the power noise, may be set by a mode register set, and the value of the code may be changed, through a test process.

The comparison unit 242 can compare the effective voltage VNRMS with the target code conversion voltage VTARCODE to output the comparison result signal 'UPDN' at a high level or a low level. For example, the comparison unit 242 can output the comparison result signal 'UPDN' by varying a logical level of the comparison result signal 'UPDN' according to whether or not the effective voltage VNRMS is higher than the target code conversion voltage VTARCODE.

The code generating unit 243 can increase or decrease the code value of the resistance value adjustment code signal 'ESRCODE<0:N>' according to the comparison result signal 'UPDN' to output the code value. Accordingly, the ESR value of the variable resistor part 210 can be changed according to the resistance value adjustment code signal 'ESRCODE<0:N>'.

Until the effective voltage VNRMS output according to the changed ESR value is lower than the target code conversion voltage VTARCODE, the power noise detecting operation of the power noise detecting section 230 and the ESR control operation of the power noise control section 240 can be repeated. Accordingly, it is possible to minimize the power noise by optimizing the intentionally designed ESR.

The exemplary optimization operation of the ESR can be performed by a method including continuously performing the ESR optimization operation during operation of the semiconductor IC, by a method of periodically performing the ESR optimization operation, and/or by a method of performing the ESR optimization operation at the time when the semiconductor IC is powered up. For example, the ESR optimization can be implemented by the various methods by adding an additional circuit component for cutting-off a current depending on an additional enable signal to components of each of the power noise detecting part 230 and the power noise control part 240 and differentiating an activation section of an enable signal.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A power noise detecting device, comprising:
a plurality of power lines; and
a power noise detecting part configured to detect power noise by rectifying voltages of the plurality of power lines and converting the rectified voltages into effective voltages that are based on the detected power noise,
wherein the power lines include a first power line and a second power line,
wherein the power noise detecting part includes:
a power noise level adjusting unit configured to decrease power noise levels at both ends of the first power line and the second power line;
a rectification unit configured to rectify voltages output from the power noise level adjusting unit; and
an effective voltage detecting unit configured to convert an output signal of the rectification unit into the effective voltage to output the effective voltage, and
wherein the effective voltage detecting unit includes a filter connected to an output terminal of the rectification unit.

2. The power noise detecting device according to claim 1, further comprising a decoupling capacitor connected between the first power line and the second power line.

3. The power noise detecting device according to claim 1, wherein the power noise level adjusting unit includes distribution resistors connected to both ends of the first power line and the second power line.

4. A power noise control device, comprising:
a variable resistor part connected to all of a plurality of power lines to vary a resistance value according to a resistance value adjustment code signal,
wherein the plurality of power lines includes a first power line and a second power line
wherein the variable resistor part includes a plurality of switching elements commonly connected to the decoupling capacitor, and
wherein the plurality of switching elements is turned on according to the resistance value adjustment code;
a power noise detecting part converting power noise of the power lines into an effective voltage to output the effective voltage, wherein the effective voltage is based on the power noise;
a power noise control part varying the resistance value adjustment code signal according to a result acquired by comparing the effective voltage with a target code conversion voltage acquired by converting a target code signal;
a decoupling capacitor connected between the first power line and the second power line; and
a plurality of resistors connected between the plurality of switching elements and the second power line;
wherein the power noise detecting part includes:
a power noise level adjusting unit configured to decrease power noise levels at both ends of the first power line and the second power line;
a rectification unit rectifying voltages output from the power noise level control part; and
an effective voltage detecting unit converting an output signal of the rectification unit into the effective voltage to output the effective voltage.

5. The power noise control device according to claim 4, wherein the power noise control part includes:
an digital/analog converting unit that converts the target code signal into the target code conversion voltage and outputs the target code conversion voltage;
a comparison unit that compares the effective voltage with the target code conversion voltage to output a comparison result signal; and
a code generating unit that increases or decreases and outputs the resistance value adjustment code according to the comparison result signal.

6. The power noise control device according to claim 5, wherein the rectification unit includes a first output terminal through which the rectified voltage is output.

7. The power noise control device according to claim 6, wherein the rectification unit includes a second output terminal connected to a ground terminal of the digital/analog converting unit.

8. The power noise control device according to claim 5, wherein the code generating unit includes a counter.

* * * * *